US012588163B2

(12) United States Patent
Wu et al.

(10) Patent No.: US 12,588,163 B2
(45) Date of Patent: Mar. 24, 2026

(54) GAS COLLECTION APPARATUS

(71) Applicant: HUAWEI TECHNOLOGIES CO., LTD., Guangdong (CN)

(72) Inventors: Huipeng Wu, Dongguan (CN); Xinpei Huang, Shenzhen (CN); Tao Liu, Wuhan (CN); Along Zhou, Yokohama (JP); Jian Shi, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 244 days.

(21) Appl. No.: 18/550,265

(22) PCT Filed: Mar. 11, 2022

(86) PCT No.: PCT/CN2022/080341
§ 371 (c)(1),
(2) Date: Sep. 12, 2023

(87) PCT Pub. No.: WO2022/188860
PCT Pub. Date: Sep. 15, 2022

(65) Prior Publication Data
US 2024/0164056 A1 May 16, 2024

(30) Foreign Application Priority Data
Mar. 12, 2021 (CN) .......................... 202110268559.2

(51) Int. Cl.
*H05K 7/20* (2006.01)
*G06F 1/20* (2006.01)
(52) U.S. Cl.
CPC ......... *H05K 7/20272* (2013.01); *G06F 1/203* (2013.01); *H05K 7/20254* (2013.01)

(58) Field of Classification Search
CPC ............ H05K 7/20272; H05K 7/20254; G06F 1/203; G06F 2200/201; F28D 15/046; F28D 15/0233; F28D 15/0266
See application file for complete search history.

(56) References Cited

U.S. PATENT DOCUMENTS 6,564,861 B1 5/2003 Miyazaki et al.
2003/0214783 A1 11/2003 Narakino et al.
(Continued)

FOREIGN PATENT DOCUMENTS

CN 1813230 A 8/2006
CN 105737647 A 7/2016
(Continued)

*Primary Examiner* — Jacob R Crum

(57) ABSTRACT

This application relates to the field of liquid cooling technologies, and provides a gas collection apparatus, configured to collect bubbles generated due to loss of a working medium in a liquid cooling apparatus. The gas collection apparatus includes a cooling plate. The cooling plate includes at least one gas collection structure disposed inside the cooling plate, a first flow channel disposed inside the cooling plate, a second flow channel disposed inside the gas collection structure, and at least one connecting channel configured to connect the first flow channel and the second flow channel. The at least one connecting channel is configured to transfer, to the second flow channel, bubbles carried when the working medium flows in the first flow channel. The at least one gas collection structure is configured to collect the bubbles from the second flow channel.

16 Claims, 9 Drawing Sheets

(56)         References Cited

U.S. PATENT DOCUMENTS

| | | | |
|---|---|---|---|
| 2004/0001312 A1 | 1/2004 | Hotta et al. | |
| 2008/0013278 A1* | 1/2008 | Landry ..................... G06F 1/20 |
| | | | 361/699 |
| 2010/0039767 A1 | 2/2010 | Katada et al. | |
| 2011/0259545 A1* | 10/2011 | Iwano .................. F16L 55/033 |
| | | | 165/41 |
| 2014/0243782 A1 | 8/2014 | Huwiler et al. | |
| 2018/0020572 A1* | 1/2018 | Fujiwara ............ H05K 7/20272 |
| 2018/0084673 A1 | 3/2018 | Asai et al. | |
| 2018/0232022 A1 | 8/2018 | Hsieh et al. | |
| 2019/0208665 A1* | 7/2019 | Tsai ................... H05K 7/20254 |

FOREIGN PATENT DOCUMENTS

| | | |
|---|---|---|
| CN | 107734916 A | 2/2018 |
| CN | 108029221 A | 5/2018 |
| CN | 112177759 A | 1/2021 |
| JP | 2010514145 A | 4/2010 |
| WO | 2011077420 A1 | 6/2011 |

* cited by examiner

Secondary flow channel 130

Cooling plate 100

Gas collection structure 120

Primary flow channel 110

Screen side

First pipeline 11

Pump 200

Keyboard side

Power component 310

Third pipeline 13

Second pipeline 12

Temperature equalizing plate 300

Pipeline 10

GAS COLLECTION APPARATUS

CROSS-REFERENCE TO RELATED APPLICATIONS

This application is a national stage application of International Application No. PCT/CN2022/080341, filed on Mar. 11, 2022, which claims priority to Chinese Patent Application No. 202110268559.2, filed on Mar. 12, 2021. Both of the aforementioned applications are hereby incorporated by reference in their entireties.

TECHNICAL FIELD

This application relates to a gas collection apparatus, and pertains to the field of liquid cooling technologies.

BACKGROUND

In recent years, as intelligent terminals develop to be light, thin, small, portable, and the like, and as power density of the intelligent terminals continuously increases, there is a higher heat dissipation requirement. However, heat dissipation effect of a conventional heat dissipation method in a small intelligent terminal is not ideal. In an existing liquid cooling apparatus, liquid with a high specific heat coefficient, for example, water, is used as a working medium to take away, through internal circulation flow, heat generated by an internal power component. However, in the existing liquid cooling apparatus, it is difficult to avoid loss of the working medium caused by leakage, evaporation, and the like. After the working medium for liquid cooling is lost, an external gas may enter the liquid cooling apparatus to supplement a volume of the lost working medium. The external gas exists in a form of a gas column or a bubble inside a module, affecting normal operation of a pump and bringing problems of excessive noise, lower heat dissipation performance, impact on a service life of the pump, and the like during operation of the pump.

For a problem that the bubble is generated due to loss of the working medium in the liquid cooling apparatus, the following technical solutions are currently used: 1: The lost working medium in the liquid cooling apparatus is supplemented by using a supplementation apparatus. 2: The external gas that enters the liquid cooling apparatus is exhausted by using an exhaust apparatus. However, both the supplementation apparatus and the exhaust apparatus are large, and cannot be used in a small terminal device such as a mobile phone or a portable computer. Therefore, it is necessary to provide a gas collection apparatus used in a liquid cooling apparatus in a small terminal device to collect bubbles in the liquid cooling apparatus.

SUMMARY

Embodiments of this application provide a gas collection apparatus, configured to collect bubbles generated due to loss of a working medium during operation of a liquid cooling apparatus. To achieve the foregoing objective, embodiments of this application provide the following technical solutions.

According to a first aspect, an embodiment of this application provides a gas collection apparatus, including:

a cooling plate, where the cooling plate includes at least one gas collection structure disposed inside the cooling plate, a first flow channel disposed inside the cooling plate, a second flow channel disposed inside the gas collection structure, and at least one connecting channel configured to connect the first flow channel and the second flow channel.

The at least one connecting channel is configured to transfer, to the second flow channel, bubbles carried when a working medium flows in the first flow channel.

The at least one gas collection structure is configured to collect the bubbles from the second flow channel.

In the foregoing structure, compared with a conventional supplementation apparatus and a conventional exhaust apparatus, the gas collection apparatus has characteristics of a smaller size, simpler operation, and no need to input external energy to maintain operation of the gas collection apparatus.

In a possible implementation, local resistance to the working medium in a process of flowing in the second flow channel is greater than local resistance to the working medium in a process of flowing in the first flow channel.

The local resistance to the working medium in the process of flowing in the second flow channel is greater than the local resistance to the working medium in the process of flowing in the first flow channel, so that a flow rate of the working medium in the second flow channel is lower than a flow rate of the working medium in the first flow channel. Therefore, after entering the second flow channel, the bubbles are unlikely to be brought back to the first flow channel by the working medium.

In a possible implementation, the local resistance to the working medium in the process of flowing in the second flow channel may be generated in the following manner:

changing a cross section of the at least one connecting channel; or increasing a quantity of bifurcation and confluence points in the second flow channel.

The local resistance is generated by changing the cross section of the at least one connecting channel or by increasing the quantity of bifurcation and confluence points in the second flow channel, so that local resistance to the working medium inside the gas collection structure may be further increased without enlarging a size of the gas collection apparatus. Therefore, a flow rate of the bubbles is reduced after the bubbles enter the second flow channel, and the bubbles are prevented from being brought back to a primary flow channel by the working medium.

In a possible implementation, a structural form of the at least one connecting channel is a connecting pipeline. One end of the connecting pipeline is connected to a local high point of the first flow channel. The other end of the connecting pipeline is connected to the second flow channel.

One end of the connecting pipeline is connected to the local high point of the first flow channel, so that when rising under an action of buoyancy force, the bubbles may more easily enter the second flow channel from the first flow channel through the connecting pipeline.

In a possible implementation, a structural form of the at least one connecting channel is a connecting opening. The connecting opening is located at a local high point of the first flow channel. One side of the connecting opening is connected to the first flow channel. The other side of the connecting opening is connected to the second flow channel. Compared with a connecting pipeline, the connecting opening has a characteristic of occupying a small size.

In a possible implementation, a cross section of the connecting pipeline is smaller than a cross section of the first flow channel and a cross section of the second flow channel.

When the working medium enters the connecting pipeline from the first flow channel, a cross section through which the working medium flows through is suddenly reduced. When the working medium enters the second flow channel from the connecting pipeline, a cross section through which the working medium flows through is suddenly enlarged. In this way, local resistance to the working medium is increased. Therefore, the flow rate of the bubbles is reduced after the bubbles enter the second flow channel, and the bubbles are prevented from being brought back to the first flow channel by the working medium.

In a possible implementation, an inclination angle between the at least one connecting channel and a flow direction of the working medium in the first flow channel is greater than 90 degrees.

The inclination angle between the connecting channel and the flow direction of the working medium in the first flow channel is greater than 90 degrees, which helps further increase the local resistance after the working medium enters the second flow channel from the first flow channel through the connecting channel. Therefore, the flow rate of the bubbles is reduced after the bubbles enter the second flow channel, and the bubbles are prevented from being brought back to the first flow channel by the working medium.

In a possible implementation, the at least one gas collection structure is a barb structure, a circular structure, or a maze structure.

The gas collection structure is the barb structure, the circular structure, or the maze structure, so that local resistance to the working medium inside the gas collection structure may be further increased. Therefore, a flow rate of the bubbles is reduced after the bubbles enter the second flow channel, and the bubbles are prevented from being brought back to a primary flow channel by the working medium.

In a possible implementation, the at least one gas collection structure includes a plurality of barrier strips. The plurality of barrier strips are configured to increase local resistance to the working medium in the second flow channel.

According to a second aspect, an embodiment of this application further provides an electronic device, including a power component and a liquid cooling apparatus. The power component generates heat in a working state. The liquid cooling apparatus transfers the heat to the outside. The electronic device further includes the gas collection apparatus according to the first aspect. The gas collection apparatus is located inside the liquid cooling apparatus, and is configured to collect bubbles in the liquid cooling apparatus.

DESCRIPTION OF EMBODIMENTS

To make objectives, technical solutions, and advantages of this application clearer, the following further describes embodiments of this application in detail with reference to the accompanying drawings.

The following describes a gas collection apparatus according to preferred embodiments of this application with reference to related figures. Figures of all implementations of this application are merely examples, and do not represent real sizes and proportions.

Direction terms used in this application, for example, up, down, left, right, front, or back, are merely defined with reference to directions in the additional figures, and are intended for ease of description rather than limiting this application.

For ease of understanding the gas collection apparatus provided in embodiments of this application, an application device and scenario of the gas collection apparatus are described. The gas collection apparatus may be used in a terminal device that uses a liquid cooling apparatus. The terminal device may be a notebook computer, a tablet computer, a mobile phone, or another intelligent terminal device. The included gas collection apparatus provided in this application may be used in a scenario that requires high power for operation, for example, cloud computing, video processing, search, or a general scenario.

Before specific implementations of this application are described, the following terms in this field are defined.

1. Working medium: In this application, the working medium, a working medium for short, is a working substance that implements heat exchange. The working medium is also referred to as a coolant or a fluid in various liquid cooling apparatuses, and is a medium material for performing heat energy exchange. The working medium may be water, or may be acetone, methanol, ammonia, or other freon-type working media such as R134a, which is selected according to a use condition.

2. Fluid resistance: The fluid resistance is resistance to a fluid in a flowing process. There are two types of fluid resistance: (1) Friction between a working medium and a wall of a device is referred to as friction resistance. (2) In a flowing process of the working medium, when a shape of a boundary of a flow channel changes, for example, a cross-sectional area of the flow channel changes, or the working medium encounters bifurcation and confluence points of the flow channel, a rate and a direction of the working medium change, and the working medium is forced to perform momentum exchange. In this case, there is great resistance to the working medium due to viscous effect of the working medium. The resistance is referred to as local resistance.

Figure 1:
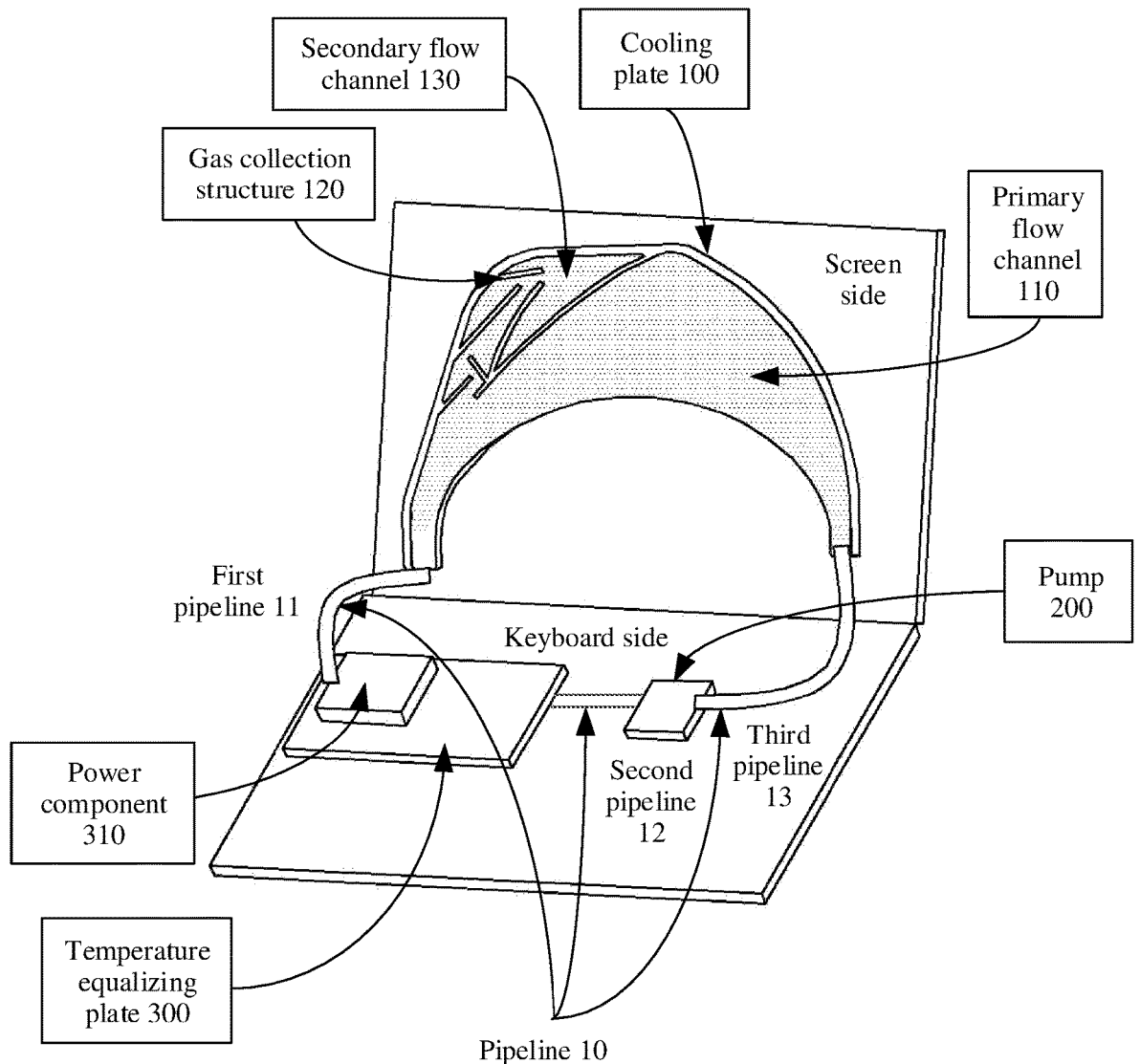
FIG. 1 is a schematic diagram of a structure of a liquid cooling apparatus according to this application.

FIG. 1 is a schematic diagram of a structure of a gas collection apparatus according to an embodiment of this application. In the embodiment of this application corresponding to FIG. 1, an example in which an electronic device is a notebook computer is used for description. The notebook computer includes a screen side and a keyboard side. It may be understood that mounting positions of components in the schematic diagram are merely examples instead of limitations.

The gas collection apparatus includes a cooling plate 100, a pump 200, a temperature equalizing plate 300, a power component 310, and a pipeline 10.

Figure 2:
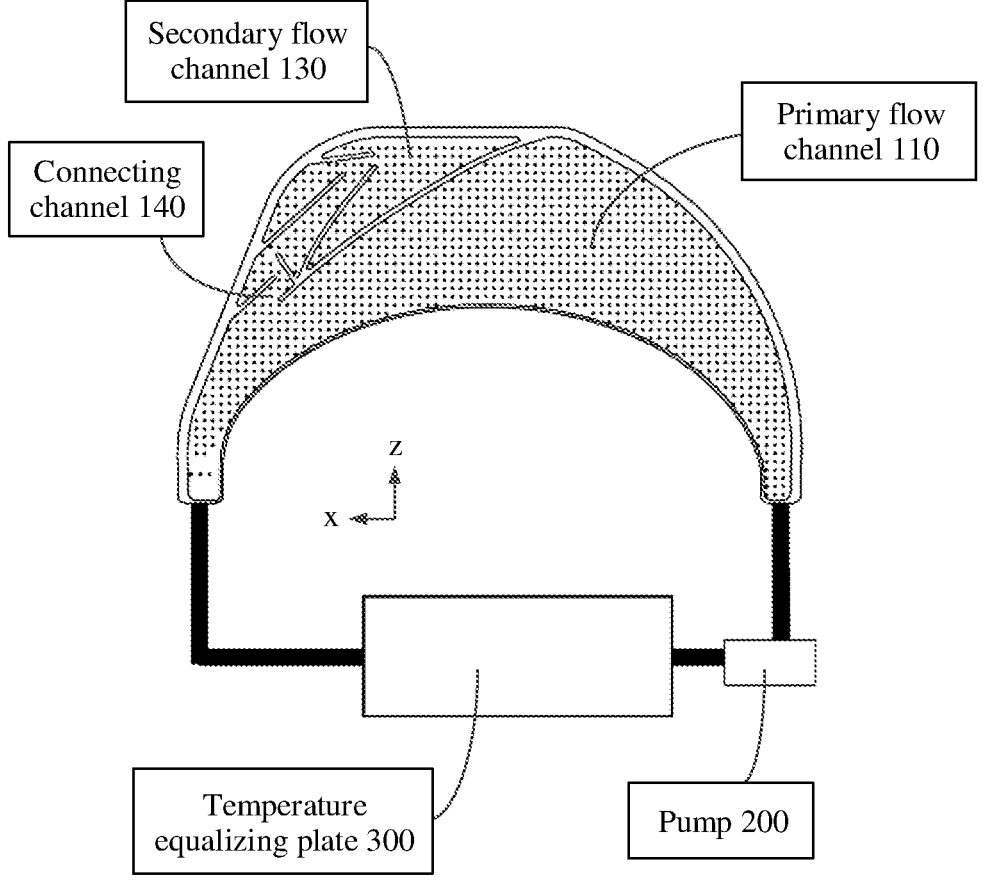
FIG. 2 is a plan view of a structure of a liquid cooling apparatus according to this application.

The cooling plate 100 includes a primary flow channel 110 and a gas collection structure 120. The gas collection structure 120 further includes a secondary flow channel 130 and a connecting channel 140. The primary flow channel 110 may also be referred to as a first flow channel, and the secondary flow channel 130 may also be referred to as a second flow channel. For the primary flow channel 110 and the secondary flow channel 130, further refer to FIG. 2.

The primary flow channel 110 is located inside the cooling plate 100. The primary flow channel is a primary route through which a working medium flows in a system, and is configured for heat exchange of a liquid cooling apparatus. The secondary flow channel 130 is located inside the gas collection structure 120. The secondary flow channel is a secondary route through which the working medium flows in the system, and is configured for bubble collection. The connecting channel 140 is located inside the gas collection structure 120, and is configured to connect the primary flow channel 110 and the secondary flow channel 130. Bubbles enter the secondary flow channel 130 from the primary flow channel 110 through the connecting channel 140.

The pipeline 10 includes a first pipeline 11, a second pipeline 12, and a third pipeline 13. A material for the pipeline 10 may be metal, for example, iron or aluminum, or may be non-metal, for example, PTFE, FEP, or EPDM. This is not specifically limited herein.

Further, the cooling plate 100 is located inside the screen side. The power component 310, the temperature equalizing plate 300, and the pump 200 are located inside the keyboard side with a heat source. The pipeline 10 is filled with the working medium, and is configured to connect the cooling plate 100, the pump 200, and the temperature equalizing plate 300. It should be noted that the pipeline 10 extends from the keyboard side to the cooling plate 100 on the screen side.

Two ends of the pump 200 are respectively connected to the cooling plate 100 and the temperature equalizing plate 300. The pump 200 may pressurize the interior of the liquid cooling apparatus, to provide circulation power for the working medium in the liquid cooling apparatus. The power generated by the pump 200 may be used to overcome impact of resistance and gravity of the working medium in a circulation process in the sealed liquid cooling apparatus, and drive the working medium to flow inside the primary flow channel 110 and the secondary flow channel 130 on the screen side, inside the temperature equalizing plate 300 and the pump 200 on the keyboard side, and between the pipeline 10, to form a complete circulation flow path of the working medium. It may be understood that the pump 200 and the temperature equalizing plate 300 can be transposed to achieve effects of this application.

The power component 310 is disposed on the temperature equalizing plate 300. The power component 310 may include but is not limited to one or more of the following power components (not shown in the figure): a circuit board, a sensor, a camera, a microphone, a battery, a graphics processing unit (GPU), a central processing unit (CPU), and the like. This is not specifically limited herein. The power component 310 continuously generates heat energy in a working process.

The temperature equalizing plate 300 may include a metal housing. A metal cover is configured to absorb the heat energy continuously generated, in the working process, by the power component 310 disposed on the temperature equalizing plate 300, and evenly disperse the heat energy to the temperature equalizing plate 300, so that the heat energy is absorbed by the working medium that flows through the temperature equalizing plate 300. The working medium transfers the heat energy to an external environment through the cooling plate 100 in a heat exchange manner in a process of flowing through the cooling plate 100. In this way, a temperature of the working medium is reduced.

With reference to the foregoing structure of the gas collection apparatus, the following describes how the working medium flows in the structure to implement cooling.

When flowing through the temperature equalizing plate 300, the working medium absorbs the heat energy generated by the power component 310. After this process is completed, the temperature of the working medium is increased. After the temperature is increased, the working medium reaches the cooling plate 100 through the pipeline 10, and performs heat exchange with the external environment through the primary flow channel 110, to reduce the temperature of the working medium. After the temperature is reduced, the working medium flows again through the temperature equalizing plate 300 through the pipeline 10 to absorb heat, and repeats the foregoing cyclic heat dissipation process to continuously release the heat generated by the power component 310 to the outside, to reduce the temperature.

It should be noted that a display screen and a driver of the display screen also generate a large amount of heat after working for a long time. The display screen and the driver of the display screen are usually mounted on the screen side. The heat may be directly transferred to the external environment through heat exchange, to achieve heat dissipation effect.

The gas collection structure 120 is located inside the cooling plate 100, and is configured to collect the bubbles in the liquid cooling apparatus. The gas collection structure 120 includes a plurality of barrier strips, configured to further increase local resistance to the working medium when the working medium flows through the gas collection structure 120, to reduce a flow rate of the working medium and prevent the bubbles from entering the primary flow channel 110 again from the gas collection structure 120.

A working process of the gas collection structure 120 is as follows: The bubbles enter the secondary flow channel 130 under an action of buoyancy force in a process of flowing with the working medium in the primary flow channel 110 under an action of the pump 200. Compared with the primary flow channel 110, the working medium has characteristics of great resistance and a low flow rate in the secondary flow channel 130. The bubbles are unlikely to be brought in the primary flow channel 130 by the working medium again, but stop at a top of the secondary flow channel 110 under the action of the buoyancy force.

It may be understood that the gas collection structure 120 may be designed in a left region of the cooling plate 100, or may be designed in a right region of the cooling plate 100. There may be one or more gas collection structures 120. A shape formed by the barrier strips in the gas collection structure 120 may be a barb structure, a circular structure, or a maze structure. There may be one or more connecting channels between the secondary flow channel 130 and the primary flow channel 110. Further, the connecting channel 140 may be in a form of a connecting pipeline, or may be in a form of a connecting opening. This is not specifically limited herein. In the embodiment corresponding to FIG. 1, a structure of the connecting channel is a structure of a connecting opening.

Figure 3:
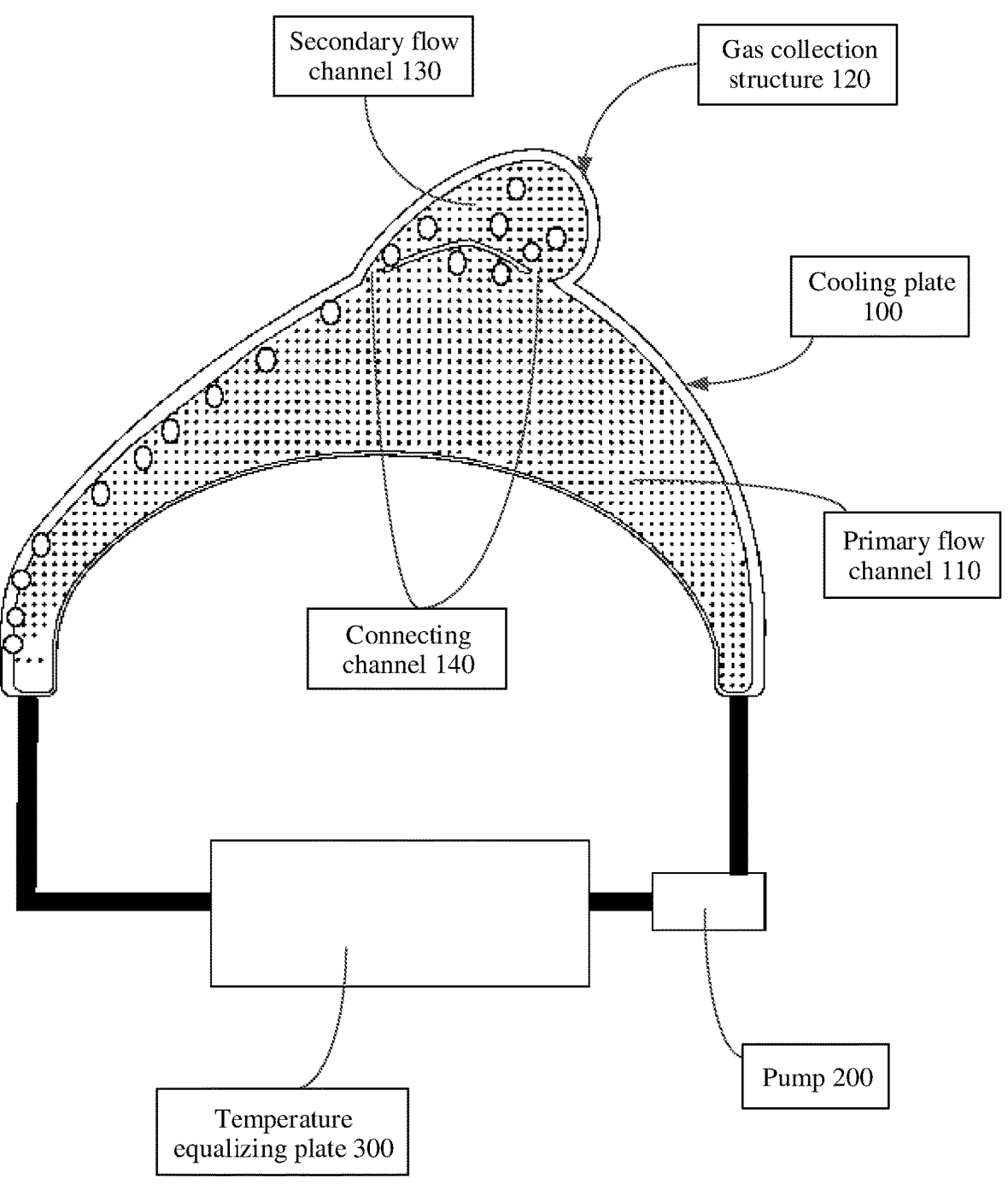
FIG. 3 is a plan view of a structure of a gas collection structure according to this application.

FIG. 3 shows a gas collection apparatus according to still another embodiment of this application. Compared with FIG. 1, no barrier strips are designed in the gas collection structure 120 shown in FIG. 3, and the connecting channel 140 is in a form of a connecting opening. Two connecting channels 140 are used between the gas collection structure 120 and the cooling plate 100 to connect the primary flow channel 110 and the secondary flow channel 130. The primary flow channel 110 is on one side of the connecting channels 140, and the secondary flow channel 130 is on the other side. When bubbles flow through the connecting channel 140 through a working medium, a flow channel cross section changes due to flow channel confluence, so that local resistance to the working medium that flows through the connecting channel 140 is increased. Therefore, a flow rate of the working medium is reduced after the working medium enters the gas collection structure 120, the bubbles are unlikely to be brought back to the primary flow channel 110 by the working medium, and bubble collection effect may be achieved. No barrier strips are designed in the gas collection structure 120 of the gas collection apparatus, so that compared with the gas collection apparatus in FIG. 1, the gas collection structure 120 occupies a smaller area.

Figure 4:
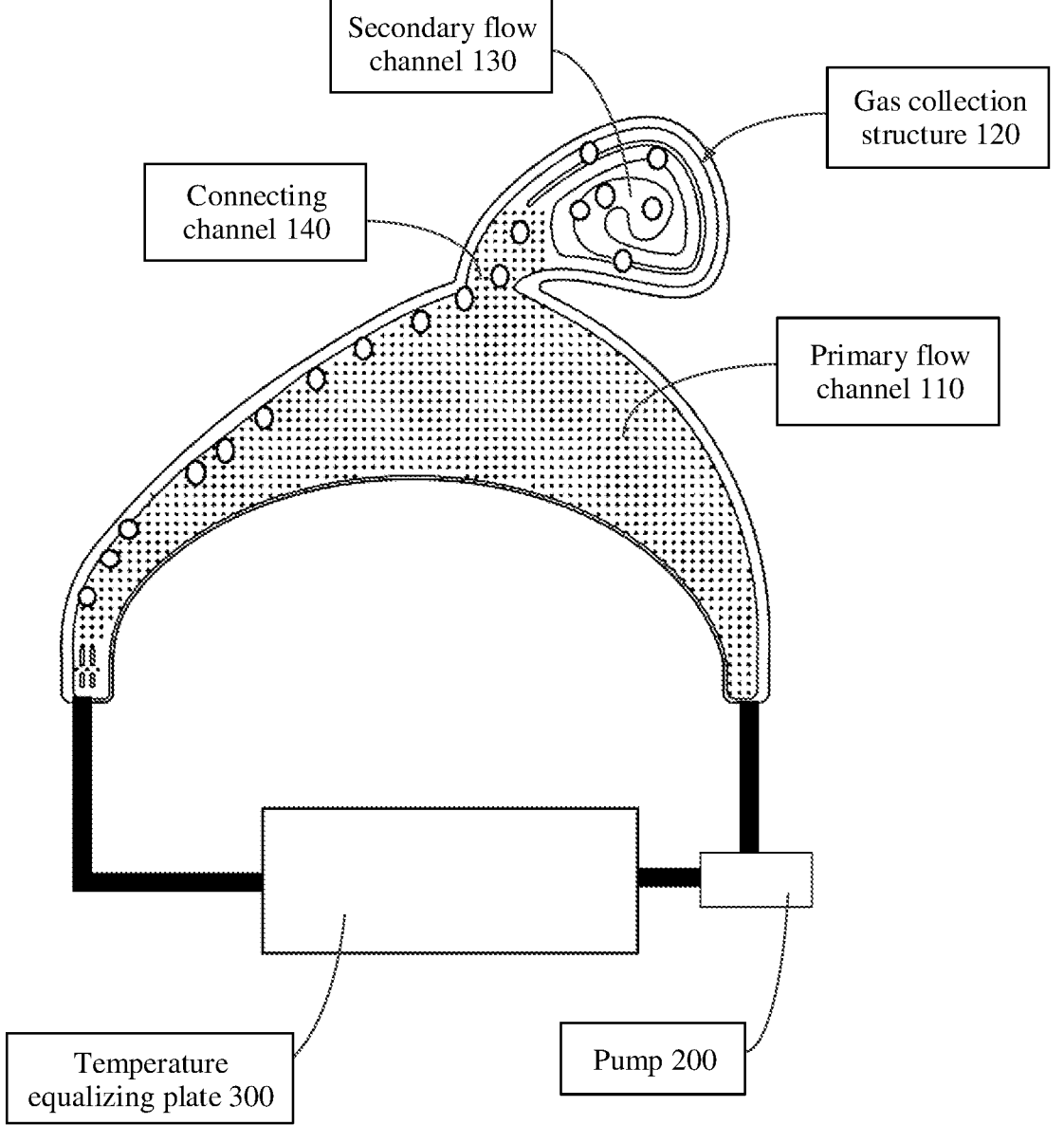
FIG. 4 is a plan view of a structure of a gas collection structure according to this application.

Refer to FIG. 4. For example, in another possible gas collection apparatus, the barrier strip inside the gas collection structure 120 is designed in a maze shape. This may further increase the local resistance to the working medium when the working medium flows in the gas collection structure 120. Therefore, the flow rate of the bubbles in the gas collection structure 120 is reduced, and the bubbles remain inside the gas collection structure 120. A structure of the connecting channel 140 is in a form of a connecting opening, configured to connect the primary flow channel 110 and the secondary flow channel 130, so that bubble collection effect may also be achieved. It should be noted that the connecting channel 140 used in the gas collection apparatus shown in FIG. 4 is of a structure of a connecting opening.

Figure 5:
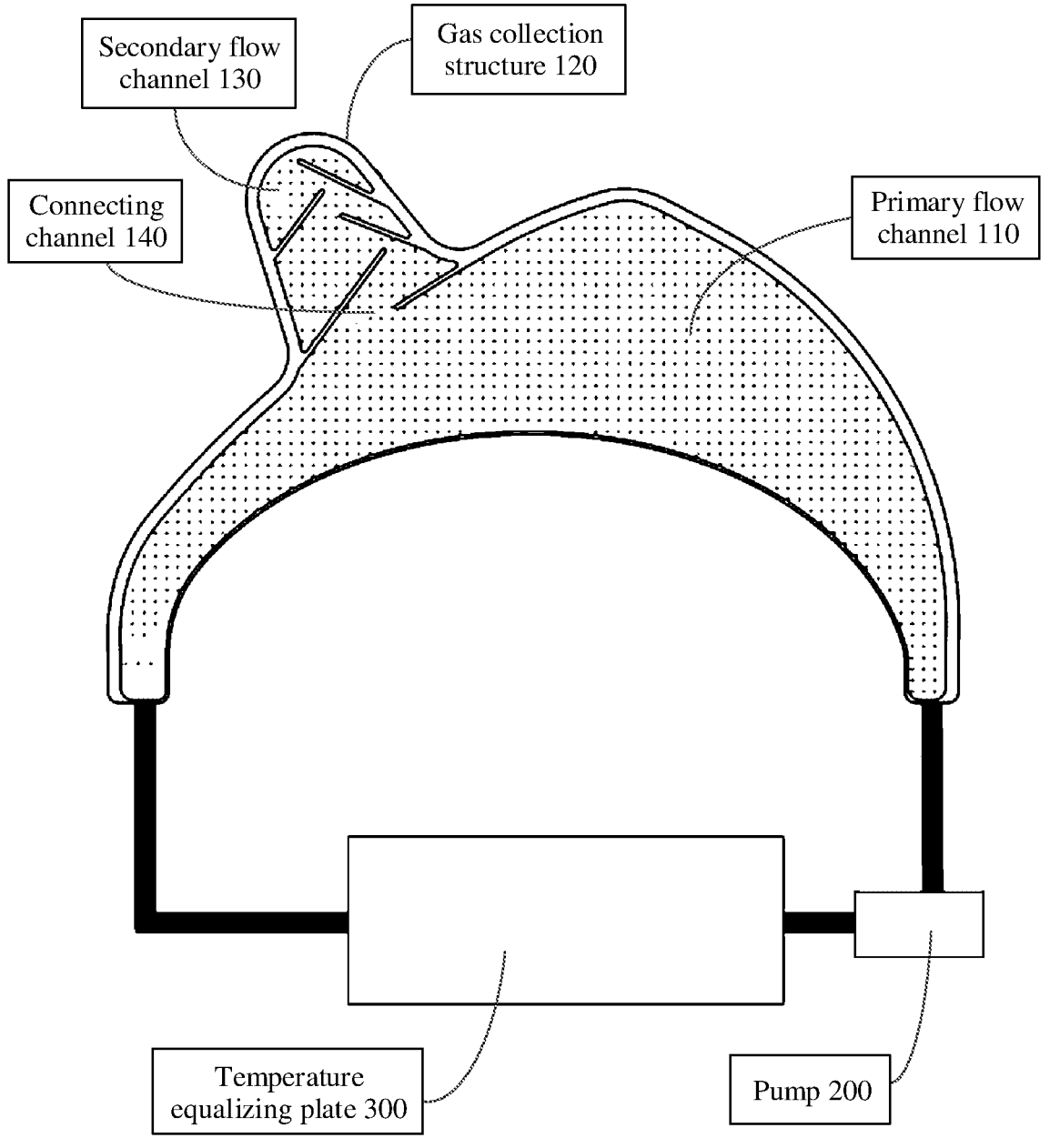
FIG. 5 is a plan view of a structure of a gas collection structure according to this application.
Figure 6:
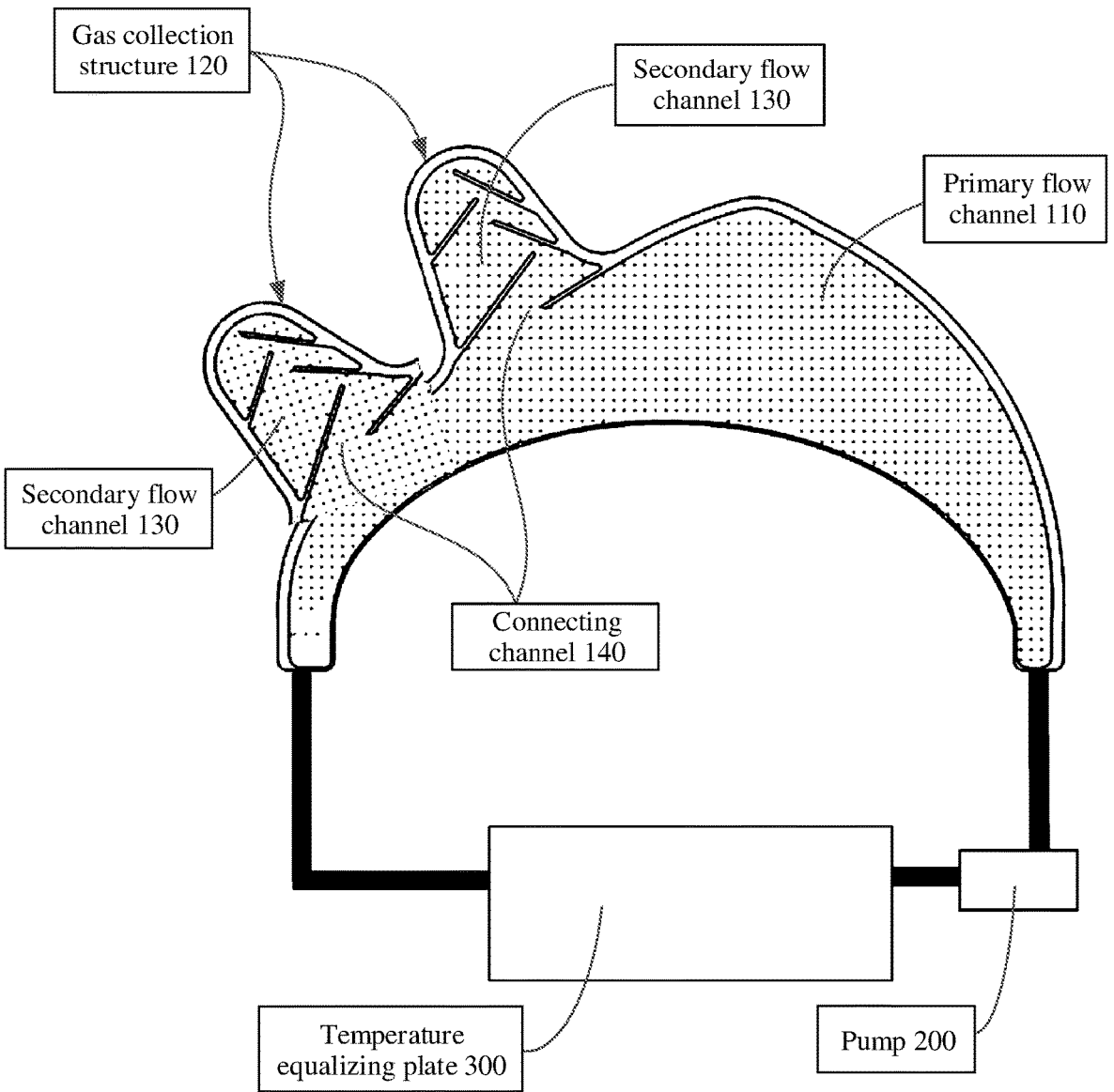
FIG. 6 is a plan view of a structure of a gas collection structure according to this application.

Refer to FIG. 5. For example, in another possible gas collection apparatus, the barrier strip inside the gas collection structure 120 may be designed in a barb shape. This may further increase the local resistance to the working medium when the working medium flows in the gas collection structure 120. Therefore, the flow rate of the bubbles in the gas collection structure 120 is reduced, and the bubbles remain inside the gas collection structure 120. There may be one or more gas collection structures 120 in the barb shape. Refer to FIG. 6. There are two gas collection structures 120 in the barb shape in the apparatus. If there are excessive bubbles, a bubble size is excessively large, or the flow rate of the working medium is excessively high, not all bubbles can be collected in time by using a first gas collection structure 120. In this case, remaining bubbles may be collected by using a second gas collection structure 120. Therefore, better bubble collection effect may be achieved. It should be noted that the connecting channel 140 in both FIG. 5 and FIG. 6 is of a structure of a connecting opening.

Figure 7:
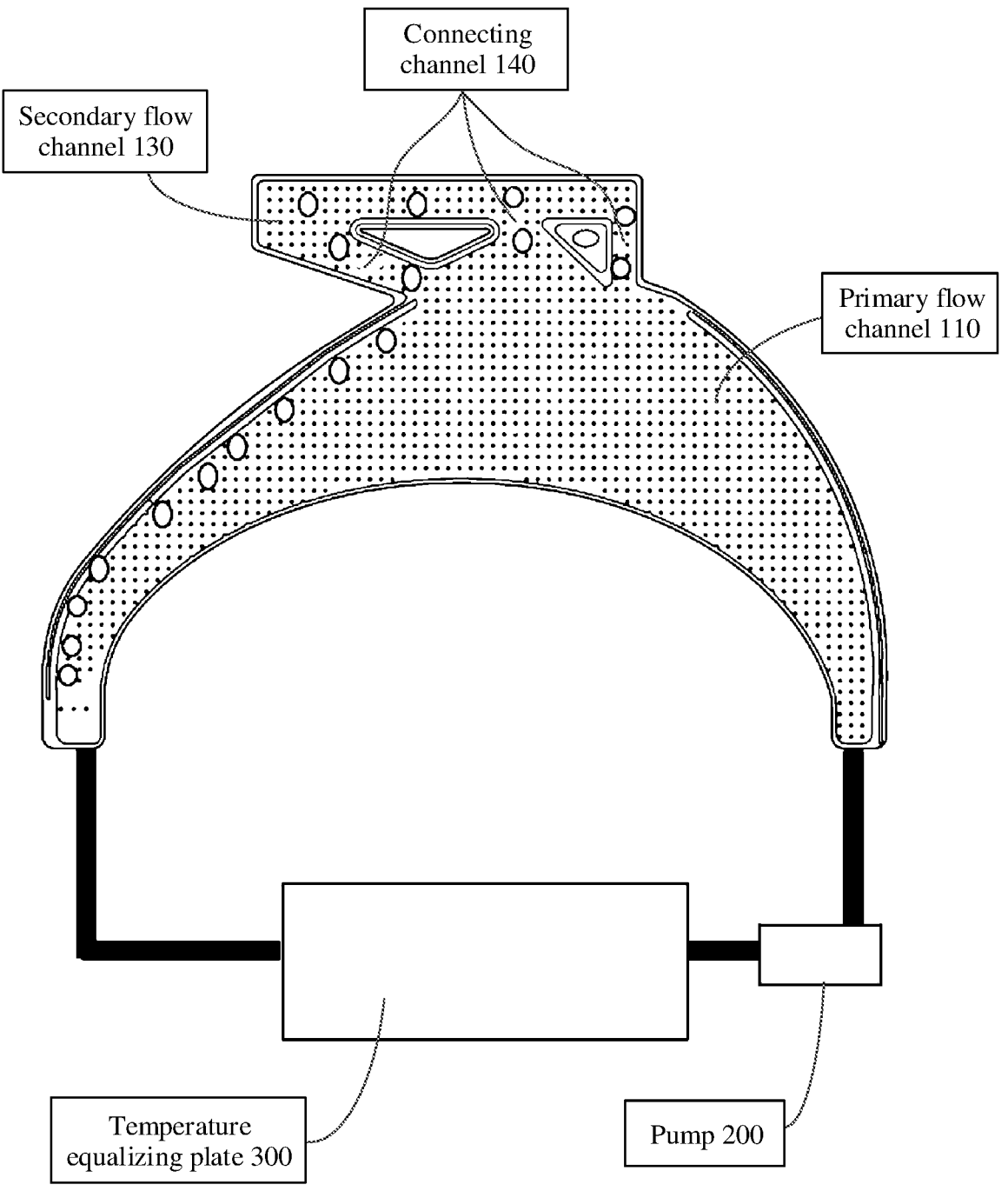
FIG. 7 is a plan view of a structure of a gas collection structure according to this application.

Refer to FIG. 7. For example, in a possible gas collection apparatus, the connecting channel 140 is disposed between the secondary flow channel 130 and the primary flow channel 110 to collect bubbles. A structure of the connecting channel 140 is a structure in a form of a connecting pipeline. There may be at least one connecting pipeline. One end of the connecting pipeline is located at a local high point of the primary flow channel 110, and is connected to the primary flow channel 110. The other end of the connecting pipeline is connected to the secondary flow channel 130. The bubbles enter the secondary flow channel 130 through the connecting channel 140 under buoyancy force, so that the bubbles are collected. If there are excessive bubbles, a bubble size is excessively large, or the flow rate of the working medium is excessively high, not all bubbles can be collected in time by using a first connecting pipeline. In this case, collect remaining bubbles may be collected by using another connecting pipeline. After the bubbles enter the gas collection structure 120, because there are a plurality of flow channel confluence and bifurcation points in the gas collection structure 120, and a flow channel cross section changes when the working medium enters the secondary flow channel 130 through the connecting pipeline 140, local resistance to the working medium when the working medium flows through the secondary flow channel 130 is greater than local resistance to the working medium when the working medium flows through the primary flow channel 110, and the flow rate of the working medium is reduced when the working medium flows through the secondary flow channel 130. The flow rate of the working medium is reduced when the working medium flows through the secondary flow channel 130, so that the bubbles are unlikely to be brought in the primary flow channel 110 by the working medium again.

Figure 8:
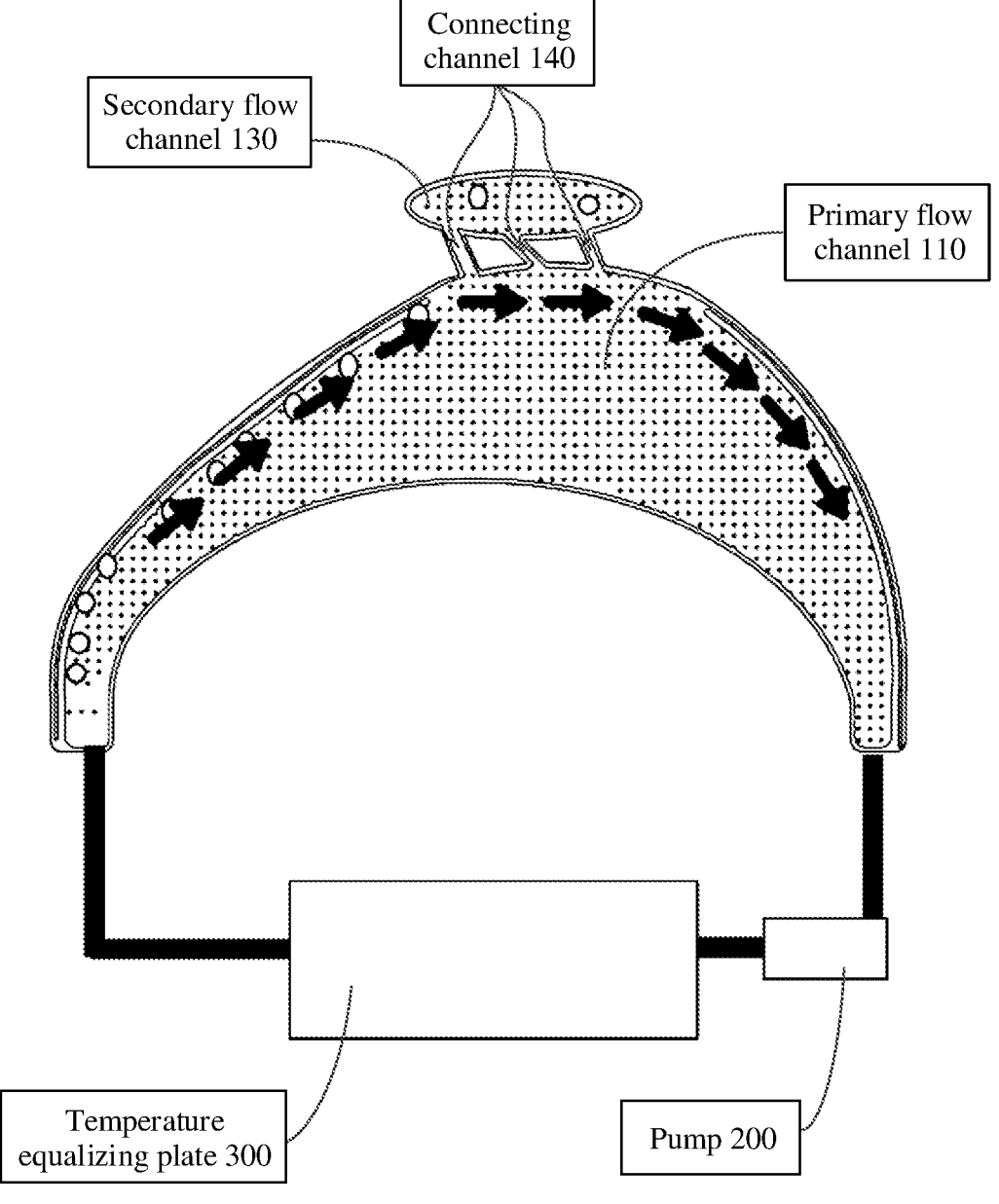
FIG. 8 is a plan view of a structure of a gas collection structure according to this application.
Figure 9:
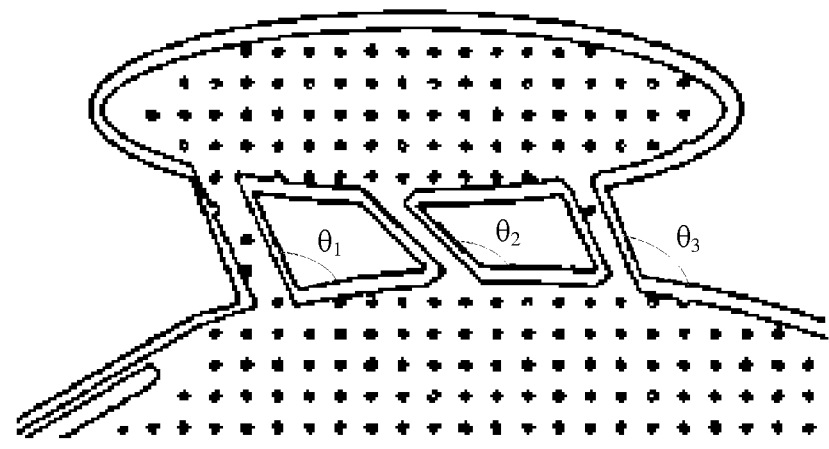
FIG. 9 is a partial enlargement view of a gas collection structure according to this application.

It may be learned with reference to FIG. 8 that, for example, in a possible gas collection apparatus, an arrow in the primary flow channel 110 represents a flow direction of the working medium. Compared with FIG. 7, an inclination angle between the connecting channel 140 in FIG. 8 and the flow direction of the working medium in the primary flow channel 110 is greater than 90 degrees, that is, three inclination angles $\theta_1$, $\theta_2$, and $\theta_3$ in FIG. 9. The inclination angle is enlarged, so that local resistance to the working medium may be effectively increased when the working medium enters the connecting channel 140. Therefore, a flow rate of the working medium in the secondary flow channel 130 is reduced. The bubbles enter the top of the secondary flow channel 130 under buoyancy force. The flow rate of the working medium in the secondary flow channel 130 is lower than that of the working medium in the primary flow channel 110, so that the bubbles are unlikely to be taken away and brought in the primary flow channel 110 by the working medium. It should be noted that a structure of the connecting channel 140 is in a form of a connecting pipeline.

The foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A gas collection apparatus, comprising:
   a cooling plate, wherein the cooling plate comprises at least one gas collection structure disposed inside the cooling plate, a first flow channel disposed inside the cooling plate, a second flow channel disposed inside the gas collection structure, and multiple connecting channels configured to couple the first flow channel and the second flow channel,
   wherein each of the multiple connecting channels is configured to transfer, to the second flow channel, bubbles carried when a working medium flows in the first flow channel, wherein the at least one gas collection structure is configured to collect the bubbles from the second flow channel, and wherein an inclination angle between the each of the connecting channels and a flow direction of the working medium in the first flow channel is greater than 90 degrees.

2. The gas collection apparatus according to claim 1, wherein local resistance to the working medium in a process of flowing in the second flow channel is greater than local resistance to the working medium in a process of flowing in the first flow channel.

3. The gas collection apparatus according to claim 2, wherein the local resistance to the working medium in the process of flowing in the second flow channel may be generated by changing a cross section of the each of the multiple connecting channels or increasing a quantity of bifurcation and confluence points in the second flow channel.

4. The gas collection apparatus according to claim 1, wherein a structural form of the each of the multiple connecting channels is a connecting pipeline, one end of the connecting pipeline is coupled to a local high point of the first flow channel, and the other end of the connecting pipeline is coupled to the second flow channel.

5. The gas collection apparatus according to claim 1, wherein a structural form of the each of the multiple connecting channels is a connecting opening, the connecting opening is located at a local high point of the first flow channel, one side of the connecting opening is coupled to the first flow channel, and the other side of the connecting opening is coupled to the second flow channel.

6. The gas collection apparatus according to claim 4, wherein a cross section of the connecting pipeline is smaller than a cross section of the first flow channel and a cross section of the second flow channel.

7. The gas collection apparatus according to claim 1, wherein the at least one gas collection structure is a barb structure, a circular structure, or a maze structure.

8. The gas collection apparatus according to claim 1, wherein the at least one gas collection structure comprises a plurality of barrier strips, and the plurality of barrier strips are configured to increase local resistance to the working medium in a process of flowing in the second flow channel.

9. An electronic device, comprising:

a power component;

a liquid cooling apparatus, wherein the power component generates heat in a working state, and the liquid cooling apparatus transfers the heat to the outside; and a gas collection apparatus, wherein the gas collection apparatus is located inside the liquid cooling apparatus, and is configured to collect bubbles in the liquid cooling apparatus, wherein the gas collection apparatus includes a cooling plate, wherein the cooling plate includes at least one gas collection structure disposed inside the cooling plate, a first flow channel disposed inside the cooling plate, a second flow channel disposed inside the gas collection structure, and multiple connecting channels configured to couple the first flow channel and the second flow channel, wherein each of the multiple connecting channels is configured to transfer, to the second flow channel, bubbles carried when a working medium flows in the first flow channel, wherein the at least one gas collection structure is configured to collect the bubbles from the second flow channel, and wherein an inclination angle between the each of the connecting channels and a flow direction of the working medium in the first flow channel is greater than 90 degrees.

10. The electronic device according to claim 9, wherein local resistance to the working medium in a process of flowing in the second flow channel is greater than local resistance to the working medium in a process of flowing in the first flow channel.

11. The electronic device according to claim 10, wherein the local resistance to the working medium in the process of flowing in the second flow channel may be generated by changing a cross section of the each of the multiple connecting channels or increasing a quantity of bifurcation and confluence points in the second flow channel.

12. The electronic device according to claim 9, wherein a structural form of the each of the multiple connecting channels is a connecting pipeline, one end of the connecting pipeline is coupled to a local high point of the first flow channel, and the other end of the connecting pipeline is coupled to the second flow channel.

13. The electronic device according to claim 9, wherein a structural form of the each of the multiple connecting channels is a connecting opening, the connecting opening is located at a local high point of the first flow channel, one side of the connecting opening is coupled to the first flow channel, and the other side of the connecting opening is coupled to the second flow channel.

14. The electronic device according to claim 12, wherein a cross section of the connecting pipeline is smaller than a cross section of the first flow channel and a cross section of the second flow channel.

15. The electronic device according to claim 9, wherein the at least one gas collection structure is a barb structure, a circular structure, or a maze structure.

16. The electronic device according to claim 9, wherein the at least one gas collection structure comprises a plurality of barrier strips, and the plurality of barrier strips are configured to increase local resistance to the working medium in a process of flowing in the second flow channel.

* * * * *